United States Patent [19]

Yamazaki et al.

[11] Patent Number: 4,938,383
[45] Date of Patent: Jul. 3, 1990

[54] DISPENSER APPARATUS

[75] Inventors: Nobuto Yamazaki, Tachikawa; Shigeru Fuke, Higashikurume; Akihiro Hirayanagi, Tachikawa, all of Japan

[73] Assignee: Kabushiki Kaisha Shinkawa, Tokyo, Japan

[21] Appl. No.: 304,803

[22] Filed: Jan. 31, 1989

[30] Foreign Application Priority Data

Apr. 13, 1988 [JP] Japan .................. 63-89115

[51] Int. Cl.⁵ .............................. B67D 5/00
[52] U.S. Cl. ....................... 222/41; 222/526; 901/20; 901/23; 901/43; 364/468
[58] Field of Search ........... 901/16, 20, 23–25, 901/38, 43; 141/181, 279; 222/160, 526, 41, 43, 46, 47, 49; 364/468, 556, 564; 118/313, 323, 388

[56] References Cited

U.S. PATENT DOCUMENTS

| | | | |
|---|---|---|---|
| 4,378,959 | 4/1983 | Susnjara | 901/20 |
| 4,600,358 | 7/1986 | Graf | 901/25 |
| 4,620,831 | 11/1986 | Poncet et al. | 901/23 |
| 4,659,018 | 4/1987 | Shulman | 901/43 |
| 4,659,971 | 4/1987 | Suzuki et al. | 901/16 |
| 4,661,368 | 4/1987 | Rohde et al. | 118/323 |
| 4,758,143 | 7/1988 | Lopes | 222/526 |
| 4,784,010 | 11/1988 | Wood et al. | 901/23 |
| 4,787,813 | 11/1988 | Stevens et al. | 901/23 |
| 4,822,647 | 4/1989 | Nozaki et al. | 901/43 |
| 4,848,606 | 7/1989 | Taguchi et al. | 222/390 |
| 4,864,966 | 9/1989 | Anderson et al. | 118/323 |

FOREIGN PATENT DOCUMENTS

2255124 11/1987 Japan ..................... 901/16

*Primary Examiner*—Joseph J. Rolla
*Assistant Examiner*—Steven Reiss
*Attorney, Agent, or Firm*—Koda & Androlia

[57] ABSTRACT

A dispenser apparatus for dropping paste onto a substrates, etc. including a syringe having a nozzle, a motor which moves the syringe up and down, a controller which controls the rotational stopping positions and rotational speed of the motor, and digital switches for inputting a setting program into the controller. The setting program sets the rotational stopping positions and rotational speed of the motor so that the position at which lowering of the nozzle stops and the speed at which the nozzle is raised are controlled through the setting program.

3 Claims, 1 Drawing Sheet

, 938, 383

DISPENSER APPARATUS

BACKGROUND OF THE INVENTION

1. Field of the Invention

The present invention relates to a dispenser apparatus which drops paste onto a work specimen such as a substrate, etc.

2. Prior Art

Conventionally, in die bonding processes for manufacturing semiconductor devices, for example, paste is dropped by means of a dispenser onto the surface of the work specimen before the bonding of dies to the work specimen is executed via a die bonding tool.

In such a dispenser, the spacing between the nozzle and the work specimen and the speed at which the nozzle is raised following the dropping of the paste are changed in accordance with the viscosity of the paste and the amount of paste to be dispensed. If the spacing between the nozzle and the work specimen is not appropriate, the paste spreads unevenly and adheres to the circumference of the nozzle, which is undesirable. If the speed at which the nozzle is raised after the paste has been dropped is inappropriate, strings of paste pulled up by the nozzle will not be broken in an appropriate manner. Thus, the formation of the paste dispensed on the surface of the work specimen will be poor.

In the conventional dispensers described above, the rotation of a motor is transmitted to a cam shaft via a gear chain, and a syringe (with a nozzle attached thereto) is driven upward and downward by a cam provided on the cam shaft. Thus, the spacing between the nozzle and the work specimen is adjusted by raising and lowering a stopper such as a screw, etc. provided on the syringe holder, and adjustment is performed visually by an operator. Changes in the speed to raise the nozzle are accomplished by replacing the aforementioned cams and gear chain.

In the prior art described above, since the spacing between the nozzle and the work specimen is adjusted manually, the adjustment not only lacks accuracy but also takes a considerable amount of time. Furthermore, since the speed to raise the nozzle is changed by replacing cams and gears, the work efficiency tends to poor, and it is difficult to adjust the apparatus to an appropriate speed which breaks the strings of paste created when the nozzle is pulled up.

SUMMARY OF THE INVENTION

The object of the present invention is to provide a dispenser apparatus which allows easy adjustment of the spacing between the nozzle and the work specimen and alteration of the nozzle-raising speed.

The abovementioned objects and other objects of the present invention are accomplished via a dispenser apparatus which includes a syringe equipped with a nozzle, a DC motor which drives the syringe up and down, a controller which controls the rotational stopping positions and rotational speed of the DC motor, and digital switches for inputting programs which set the rotational stopping positions and rotational speed of the DC motor into the controller. The position to which the nozzle is lowered and the speed at which the nozzle is raised are controlled by the setting programs.

Since the nozzle is raised and lowered by the DC motor and the position to which the nozzle is lowered is determined by the rotational stopping position of the DC motor at the end of the downward stroke of the nozzle, the spacing between the nozzle and the work specimen can be adjusted by altering the setting program which sets the rotational stopping positions of the DC motor and is input in the controller via the digital switches.

Furthermore, the speed at which the nozzle is raised after paste is dropped can be adjusted so that no paste strings are formed by altering the setting program which sets the rotational speed of the DC motor and is input in the controller via the digital switches.

Thus, the spacing between the nozzle and the work specimen as well as the adjustment of the speed at which the nozzle is raised can be adjusted exclusively by means of the setting programs, which are in turn controlled by means of digital switches. Accordingly, working efficiency is excellent, and the formation of strings of paste can be well regulated.

DETAILED DESCRIPTION OF THE INVENTION

Figure 1:
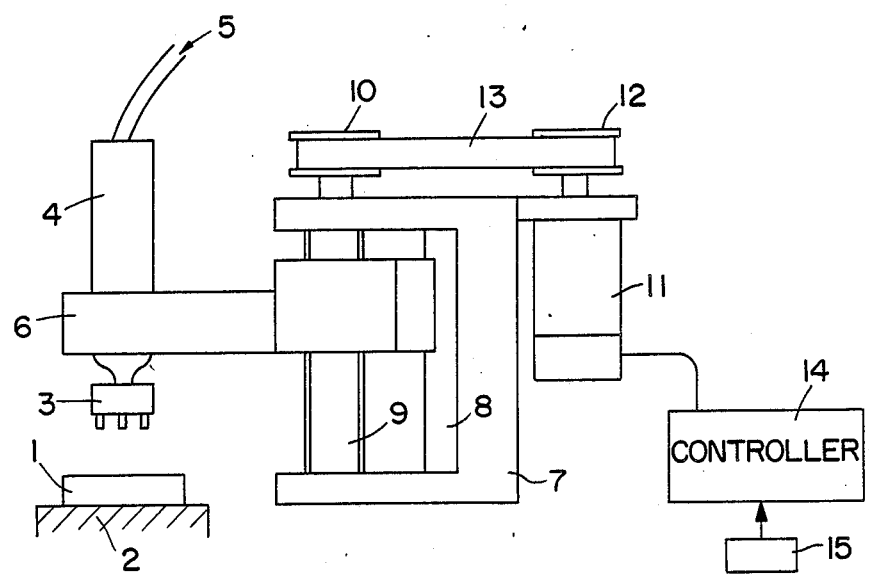
FIG. 1 is a front view which illustrates one embodiment of the present invention.

A description of an embodiment of the present invention will be given below with reference to the accompanying drawings.

A syringe 4 which has a nozzle 3 at its lower end is provided above a specimen table 2. On this specimen table 2, a work specimen 1 is placed. When paste is dropped on the specimen 1, air 5 is supplied to the syringe 4 from an air supply source (not shown). The syringe 4 is held by a syringe holder 6, and this syringe holder 6 is installed so that it is free to move up and down on an upright guide 8 installed in a frame 7.

A screw 9 provided uprightly in the frame 7 is arranged so that it is free to rotate. The syringe holder 6 engages with this screw 9. A pulley 10 is mounted to one end of the screw 9, and a belt 13 is installed between this pulley 10 and another pulley 12 which is mounted to the output shaft of a DC motor 11 provided in the frame 7. This DC motor 11 is arranged so that its rotational stopping positions and rotational speed are controlled by a controller 14. The values set for the rotational stopping positions and rotational speed in this controller 14 are set through digital switches 15.

Figure 2:
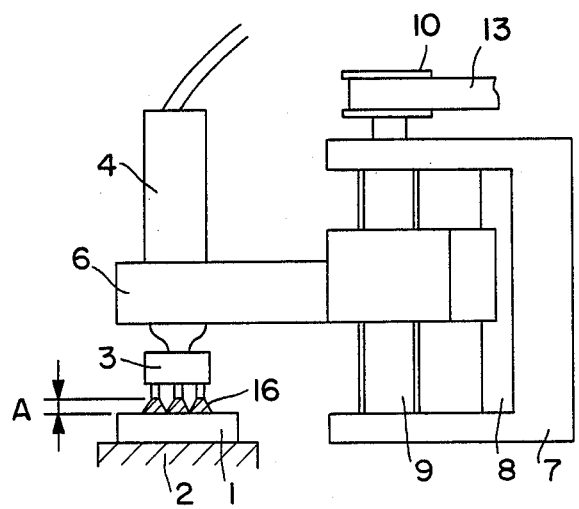
FIG. 2 is a front view which illustrates the paste dropping process in the apparatus of FIG. 1.

In operation, the rotation of the DC motor 11 is transmitted to the screw 9 via the pulley 12, belt 13 and pulley 10. When the screw 9 rotates, the syringe 4 and nozzle 3 move up and down along with the syringe holder 6. Specifically, when the DC motor 11 rotates a given amount (beginning with the state illustrated in FIG. 1) so that the nozzle 3 is lowered and stopped with a space A between the lower end of the nozzle 3 and the work specimen 1 as shown in FIG. 2, air 5 is supplied to the syringe 4, and a fixed amount of paste 16 is forced out onto the surface of the work specimen 1 from the syringe 4. After the paste has been dropped, the DC motor 11 is rotated in the opposite direction so that the nozzle 3 is raised.

Thus, the position to which the nozzle 3 is lowered, i.e., the space A between the nozzle 3 and the work specimen 1 when the nozzle 3 is fully lowered, is determined by the rotational stopping position of the DC motor 11 at the end of this lowering stroke. Since this rotational stopping position of the DC motor 11 is determined by a rotational stopping position program set in the controller 14, the rotational stopping position can easily be adjusted by altering the set value of the rotational stopping position by means of the digital switches 15.

Similarly, the speed at which the nozzle 3 is raised can easily be adjusted in order to regulate formation of strings of paste by adjusting the rotational speed of the DC motor 11. This is accomplished by altering the rotational speed program set in the controller 14 by means of the digital switches 15.

The appropriate distance of the space A for obtaining optimal dropping conditions, and the appropriate nozzle-raising speed for preventing the formation of paste strings can be determined by experiment in accordance with the viscosity of the paste, amount of paste that is dispensed, etc.

As is clear from the above description, the present invention allows easy adjustment of the spacing between the nozzle and the work specimen and of the speed at which the nozzle is raised to appropriate values.

We claim:
1. A dispenser apparatus comprising:
   a syringe equipped with a nozzle;
   a rotational driving means which drives said syringe upward and downward;
   a controller which controls the rotational stopping positions and rotational speed of said driving means; and
   digital switches for inputting programs into said controller, said program setting the rotational stopping positions and rotational speed of said driving means, and the position to which said nozzle is lowered and the speed at which said nozzle is raised being controlled by said setting program.
2. A dispenser apparatus according to claim 1, wherein said driving means is a DC motor.
3. A dispenser according to claim 2 wherein said nozzle is provided with a plurality of ports whereby paste may be simultaneously dispensed from the plurality of ports by actuation of the syringe.

* * * * *